US006634016B1

(12) United States Patent
Farooq

(10) Patent No.: US 6,634,016 B1
(45) Date of Patent: Oct. 14, 2003

(54) ARRANGEMENT FOR PARTITIONING LOGIC INTO MULTIPLE FIELD PROGRAMMABLE GATE ARRAYS

(75) Inventor: Rizwan M. Farooq, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 146 days.

(21) Appl. No.: 09/726,447

(22) Filed: Dec. 1, 2000

(51) Int. Cl.[7] ............................................. G06F 17/50
(52) U.S. Cl. ..................... 716/7; 716/1; 716/2; 716/4; 716/5; 716/16; 716/18; 714/735; 714/738
(58) Field of Search ...................... 716/1–21; 370/358; 703/14, 16, 17, 21, 23; 324/158.1, 768; 379/27.01, 29.04; 438/14; 709/249; 710/104, 305; 714/30, 33, 724, 735

(56) References Cited

U.S. PATENT DOCUMENTS

| 5,828,579 A | * 10/1998 | Beausang ..................... 716/2 |
| 5,953,335 A | 9/1999 | Erimli et al. |
| 6,182,183 B1 | * 1/2001 | Wingard et al. ............ 710/305 |
| 6,197,605 B1 | * 3/2001 | Simunic et al. ............... 438/14 |

OTHER PUBLICATIONS

Lo et al., "Hardware emulation board based on FPGAs and programmable interconnections", 1994, Fifth International Workshop on, pp.: 126–130.*

* cited by examiner

Primary Examiner—Vuthe Siek
Assistant Examiner—Helen B Rossoshek
(74) Attorney, Agent, or Firm—Manelli Denison & Selter PLLC; Leon R. Turkevich

(57) ABSTRACT

A test system for a design of a network device under test, having multiple design modules, includes multiple field programmable gate arrays configured for performing operations of the respective design modules. The test system also includes shared resources, where each field programmable gate array includes resource control logic for accessing the shared resources according to a prescribed shared resource protocol. Hence, the resource control logic of each of the field programmable gate arrays cooperate to ensure there is no interference between the multiple field programmable gate arrays for the shared resources. Hence, a design can be partitioned into multiple field programmable gate arrays, enabling testing of large scale designs; moreover, the partitioning of the design into multiple FPGAs enables each design module to be separately controlled, enabling design revisions to different design modules as necessary, without any other modification to the remaining test system.

10 Claims, 2 Drawing Sheets

ARRANGEMENT FOR PARTITIONING LOGIC INTO MULTIPLE FIELD PROGRAMMABLE GATE ARRAYS

BACKGROUND OF THE INVENTION

1. Field of the Invention

The present invention relates to testing the design of a prescribed system using field programmable gate arrays prior to implementation on mass-produced application-specific integrated circuits (ASICs).

2. Background Art

Local area networks use a network cable or other media to link stations on the network. Each local area network architecture uses a media access control (MAC) enabling network interface devices at each network node to access the network medium.

Switched local area networks such as Ethernet (IEEE 802.3) based systems are encountering increasing demands for higher speed connectivity, more flexible switching performance, and the ability to accommodate more complex network architectures. Hence, network switch designers and test engineers need to be able to minimize the time and expense needed to evaluate designs during prototyping of Ethernet-based network systems, for example an integrated multiport switch as illustrated in commonly-assigned U.S. Pat. No. 5,953,335.

Integrated network switches are implemented by reduction to silicon as an application-specific integrated circuit. Implementation of such integrated network switches using application-specific integrated circuits (ASICs) typically requires reduction to silicon of large amounts of programming code, written for example at Register Transfer Level (RTL) using Hardware Description Language (HDL). The programming code is used to specify the operations for the network switch.

Typically field programmable ASICs, for example field programmable gate arrays (FPGAs), can be used for testing the design, logic and operation of a device under test on a test board; once the design of the device under test has been fully tested and validated, the design of the device under test is converted to a mask programmable ASIC for production purposes.

A problem with testing more complex designs involves the limited availability of large scale FPGAs for testing the more complex designs. In particular, the more complex designs (e.g., a high-speed network switch) often exceeds the capacity of field programmable gate arrays (e.g., 150 k usable gates). Moreover, attempts to partition the design onto separate FPGAs interconnected on a test board are not possible, since the original design uses shared resources to optimize space on the silicon chip. Hence, the testing of more complex designs requires that the design be simulated in software, or that a limited number of test ASIC samples be manufactured using mask programming to test the more complex design. Consequently, testing becomes more difficult as design changes need to be made.

SUMMARY OF THE INVENTION

There is a need for an arrangement that enables a design to be partitioned into multiple field programmable gate arrays for testing of the design prior to commercial production.

There also is a need for an arrangement that enables design revisions to be implemented using existing test procedures, with minimal modification to the test equipment.

These and other needs are attained by the present invention, where a test system for a design of a network device under test, having multiple design modules, includes multiple field programmable gate arrays configured for performing operations of the respective design modules. The test system also includes shared resources, where each field programmable gate array includes resource control logic for accessing the shared resources according to a prescribed shared resource protocol. Hence, the resource control logic of each of the field programmable gate arrays cooperate to ensure there is no interference between the multiple field programmable gate arrays for the shared resources. Hence, a design can be partitioned into multiple field programmable gate arrays, enabling testing of large scale designs; moreover, the partitioning of the design into multiple FPGAs enables each design module to be separately controlled, enabling design revisions to different design modules as necessary, without any other modification to the remaining test system.

One aspect of the present invention provides a method of testing a design for an integrated device having multiple design modules. The method includes dividing the design modules into respective field programmable gate arrays based on prescribed module boundaries, identifying shared resources used by the multiple design modules, and adding resource control logic to each field programmable gate array for accessing the shared resources according to a prescribed shared resource protocol.

Another aspect of the present invention provides a test system for testing a design for an integrated device having multiple design modules. The test system includes a plurality of field programmable gate arrays, each configured for performing prescribed operations for the corresponding one of the design modules. Each field programmable gate array also includes a resource control logic unit. The test system also includes a shared resource configured for use by the field programmable gate arrays according to a prescribed shared resource protocol, each of the resource control logic units controlling access by the corresponding field programmable gate array to the shared resources according to the prescribed shared resource protocol.

Additional advantages and novel features of the invention will be set forth in part in the description which follows and in part will become apparent to those skilled in the art upon examination of the following or may be learned by practice of the invention. The advantages of the present invention may be realized and attained by means of instrumentalities and combinations particularly pointed in the appended claims.

BRIEF DESCRIPTION OF THE DRAWINGS

Reference is made to the attached drawings, wherein elements having the same reference numeral designations represent like elements throughout and wherein.

BEST MODE FOR CARRYING OUT THE INVENTION

Figure 1:
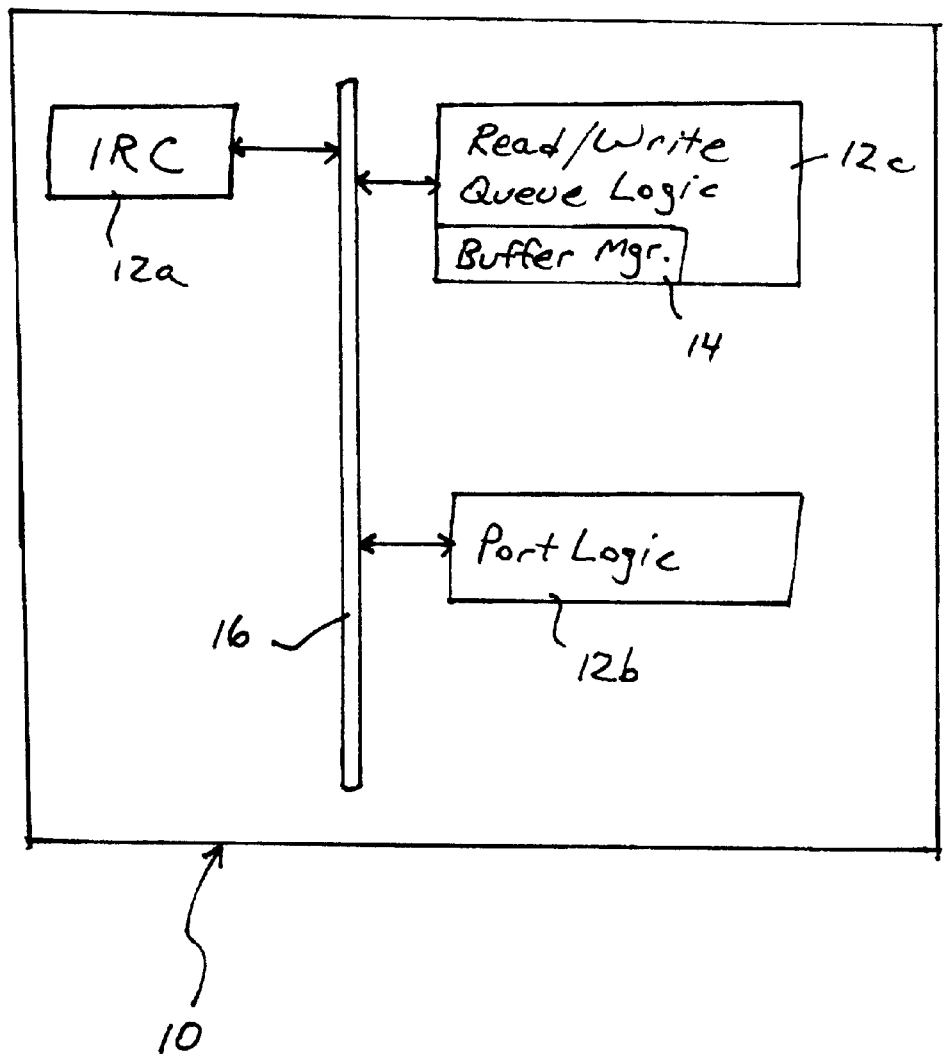
FIG. 1 is a block diagram illustrating a design of a network device to be tested prior to commercial production.

FIG. 1 is a block diagram illustrating a design for a network device, for example an integrated multiport network switch, as described in the above-identified U.S. Pat. No. 5,953,335. In particular, the design 10 includes multiple design modules 12 configured for performing respective design operations. For example, each design module 12 may be generated using design tools configured for converting prescribed operations, for example register transfer language code, into a selected hardware format, for example a field programmable gate array or a mask programmable ASIC device. Each design module is configured for performing a prescribed operation. For example, the internal rules checker 12a is configured for performing switching operations including frame forwarding decisions, the port logic 12b is configured for performing transmit and receive operations for the network ports, and the read/write queue logic 12c is configured for controlling the transfer of frame data between the port logic 12b and an external memory (not shown), based on the frame forwarding decisions by the internal rules checker 12a. The external memory is used to store the fame data while the internal rules checker 12a is performing the frame forwarding decisions. Data is passed between the design modules 12 via a bidirectional bus 16 under the control of a buffer manager 14 within the read/write queue logic 12c; each of the design modules 12 also are able to receive information from the buffer manager 14 regarding arbitration for the bidirectional bus 16.

As described above, the complexity of the design 10 for the multiport network switch may exceed the capacity of existing field programmable gate arrays. Hence, design 10 is partitioned according to the boundaries of the design modules 12 for implementation within respective field programmable gate arrays, illustrated in FIG. 2.

Figure 2:
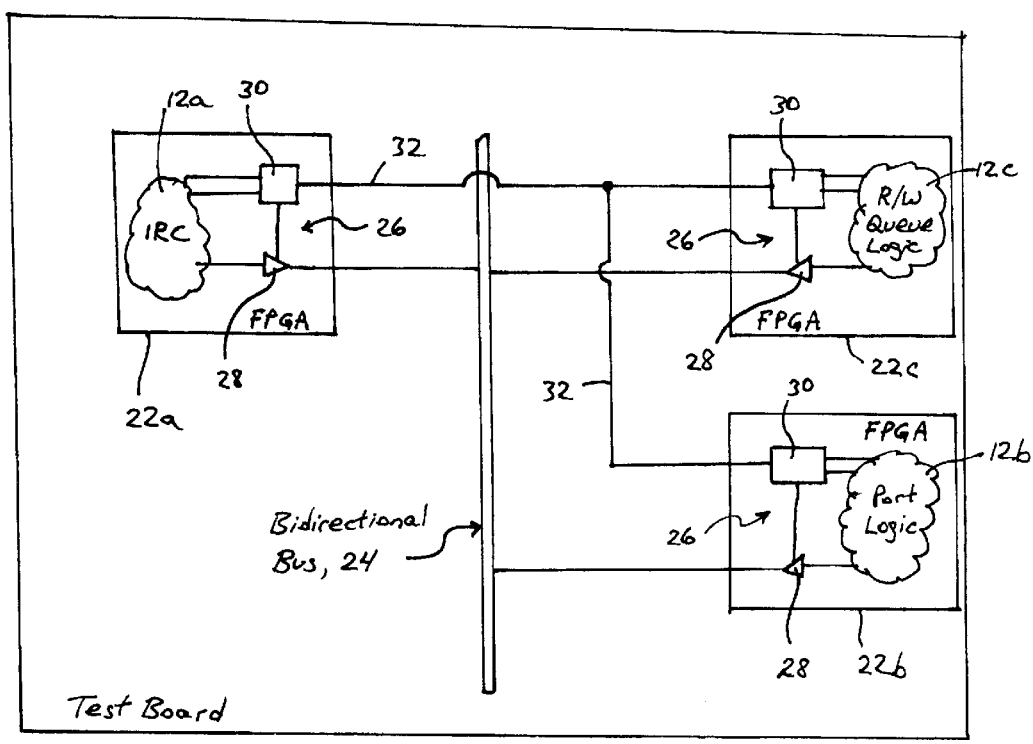
FIG. 2 is a diagram illustrating a system for testing the design of the network device of FIG. 1 according to an embodiment of the present invention.

FIG. 2 is a diagram illustrating a system for testing the design of the network device of FIG. 1 according to an embodiment of the present invention. The test system 20 is implemented as a board having multiple field programmable gate arrays 22, each configured for implementing a corresponding at least one RTL design module 12. For example, the FPGAs 22a, 22b, and 22c implement the operations of the internal rules checker module 12a, the port logic 12b, and the read/write queue logic 12c, respectively. If desired, a given FPGA 22 may implement multiple RTL modules 12, depending on the capacity of the FPGA 22. The system 20 also includes a shared resource, for example a bidirectional data bus 24 on the test board for transfer of data between the board components including the FPGAs 22.

Although the design 10 includes a buffer manager 14, the partitioning of the design modules 12 into separate FPGAs 22 causes the design modules 12a and 12b to no longer have access to the state information of the buffer manager 14. Hence, the absence of any additional control could cause interference on the bidirectional bus 24 due to uncontrolled access by the FPGAs 22.

According to the disclosed embodiment, resource control logic 26 is added to each FPGA 22 for accessing the shared bidirectional bus 24 according to a prescribed shared resource protocol. In particular, each resource control logic 26 includes a tristate buffer 28 configured for controlling the access to the bidirectional bus 24 by the corresponding FPGA 22, and a control logic unit 30. The control logic units 30 are in communication via a control link 32, and the control logic units 30 arbitrate access to the bidirectional bus 24 according to a prescribed shared resource protocol, for example a round robin access, priority access, etc. Each control logic unit 30 controls the corresponding tristate buffer to enable the corresponding FPGA 22 to access the shared bidirectional bus 24. Hence, a relatively large design 10 can be partitioned into smaller FPGAs 22 configured for performing respective design module operations, while still able to share resources despite the partitioning of control logic.

While this invention has been described with what is presently considered to be the most practical preferred embodiment, it is to be understood that the invention is not limited to the disclosed embodiments, but, on the contrary, is intended to cover various modifications and equivalent arrangements included within the spirit and scope of the appended claims.

What is claimed is:

1. A method of enabling testing of a design for an integrated device having multiple design modules, the method comprising:

dividing the design modules into respective field programmable gate arrays based on prescribed module boundaries;

identifying shared resources used by the multiple design modules; and adding resource control logic internally into each field programmable gate array for accessing the shared resources according to a prescribed shared resource protocol.

2. The method of claim 1, wherein the identifying step includes identifying a bidirectional bus for communication of data by the field programmable gate arrays.

3. The method of claim 2, wherein the adding step includes adding tristate buffers to control the access to the bidirectional bus by the corresponding field programmable gate array.

4. The method of claim 3, wherein each field programmable gate array is configured for performing operations for the corresponding design module.

5. The method of claim 3, wherein the adding step further includes:

adding, to each resource control logic, a control logic unit configured for controlling the corresponding tristate buffer; and connecting the control logic units of the respective field programmable gate arrays via a control link for arbitrating access to the shared resources according to the prescribed shared resource protocol.

6. The method of claim 4, wherein the design module is a register transfer language module.

7. A test system for enabling testing of a design for an integrated device having multiple design modules, the test system comprising:

a plurality of field programmable gate arrays, each configured for performing prescribed operations for the corresponding one of the design modules, each field programmable gate array comprising a resource control logic unit; and a shared resource configured for use by the field programmable gate arrays according to a prescribed shared resource protocol, each resource control logic unit controlling access by the corresponding field programmable gate array to the shared resource according to the prescribed shared resource protocol.

8. The system of claim 7, wherein the shared resource is a bidirectional bus on a test board.

9. The system of claim 8, each resource control logic unit includes a tristate buffer configured for controlling the access to the bidirectional bus by the corresponding field programmable gate array, and a control logic unit, the control logic unit's in communication for arbitrating access to the bidirectional bus according to the prescribed shared resource protocol.

10. The system of claim 8, wherein each field programmable gate array performs a prescribed operations for the corresponding design module based on register transfer language.

* * * * *